(12) United States Patent
Dubey et al.

(10) Patent No.: US 9,887,104 B2
(45) Date of Patent: Feb. 6, 2018

(54) ELECTRONIC PACKAGE AND METHOD OF CONNECTING A FIRST DIE TO A SECOND DIE TO FORM AN ELECTRONIC PACKAGE

(71) Applicant: Intel Corporation, Santa Clara, CA (US)

(72) Inventors: Manish Dubey, Chandler, AZ (US); Rajendra C. Dias, Phoenix, AZ (US); Patrick Nardi, Scottsdale, AZ (US); David Woodhams, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/323,077

(22) Filed: Jul. 3, 2014

(65) Prior Publication Data
US 2016/0005672 A1    Jan. 7, 2016

(51) Int. Cl.
*H01L 23/31* (2006.01)
*H01L 21/56* (2006.01)
(Continued)

(52) U.S. Cl.
CPC ............ *H01L 21/563* (2013.01); *H01L 23/24* (2013.01); *H01L 24/32* (2013.01);
(Continued)

(58) Field of Classification Search
CPC ..... H01L 23/3185; H01L 21/56; H01L 23/24; H01L 24/32; H01L 2224/16225;
(Continued)

(56) References Cited

U.S. PATENT DOCUMENTS

| 278,046 A | 5/1883 | Rhodes |
| 1,320,888 A | 11/1919 | Miller et al. |

(Continued)

FOREIGN PATENT DOCUMENTS

| DE | 102008008920 A1 | 8/2008 |
| JP | 2010263108 A * | 11/2010 |

(Continued)

OTHER PUBLICATIONS

Taiwanese Application Serial No. 104119398, Response filed Jun. 15, 2016 to Office Action dated Mar. 16, 2016, W/ English Translation Of Claims, 13 pgs.
(Continued)

*Primary Examiner* — Ermias Woldegeorgis
(74) *Attorney, Agent, or Firm* — Schwegman Lundberg & Woessner, P.A.

(57) ABSTRACT

Some embodiments relate to an electronic package. The electronic package includes a substrate and a die attached to the substrate. The electronic package further includes an underfill positioned between the die and the substrate due to capillary action. A support surrounds the die. The support provides the same beneficial fillet geometry on all die edges. Therefore, the support provides similar stress reduction on all die edges. Other embodiments relate to method of fabricating an electronic package. The method includes attaching a die to a substrate and inserting an underfill between the die and the substrate using capillary action. The method further includes placing a support around the die such that the support surrounds the die.

7 Claims, 7 Drawing Sheets

(51) Int. Cl.
*H01L 23/24* (2006.01)
*H01L 23/00* (2006.01)

(52) U.S. Cl.
CPC ............... *H01L 2224/16225* (2013.01); *H01L 2224/32225* (2013.01); *H01L 2224/73203* (2013.01); *H01L 2224/73204* (2013.01); *H01L 2224/83951* (2013.01); *H01L 2924/15311* (2013.01)

(58) Field of Classification Search
CPC . H01L 2224/73203; H01L 2224/73204; H01L 2924/15311; H01L 2224/32225
See application file for complete search history.

(56) References Cited

U.S. PATENT DOCUMENTS

| | | | |
|---|---|---|---|
| 1,476,634 | A | 12/1923 | Neighbour |
| 6,048,656 | A * | 4/2000 | Akram ................. H01L 21/563 257/787 |
| 6,617,682 | B1 | 9/2003 | Ma et al. |
| 2004/0087061 | A1 | 5/2004 | Ma et al. |
| 2008/0191344 | A1 | 8/2008 | Vervoot et al. |
| 2010/0078791 | A1* | 4/2010 | Yim ................. H01L 25/0655 257/686 |
| 2011/0147912 | A1* | 6/2011 | Karpur ................. H01L 21/563 257/687 |
| 2011/0260338 | A1* | 10/2011 | Lee ................. H01L 21/563 257/778 |

FOREIGN PATENT DOCUMENTS

| | | |
|---|---|---|
| JP | 2010263108 A | 11/2010 |
| JP | 2012156389 A | 8/2012 |
| KR | 101246883 B1 | 3/2013 |
| WO | Wo-9633201 A1 | 10/1996 |
| WO | WO-2002027788 A2 | 4/2002 |

OTHER PUBLICATIONS

"Japanese Application Serial No. 2015-126331, Office Action dated Jul. 26, 2016", (With English Translation), 16 pgs.

"Japanese Application Serial No. 2015-1225331 Response filed Oct. 21, 2016 to Office Action dated Jul. 26, 2016", w/ English Claims, 6 pgs.

"Taiwanese Application Serial No. 104119398, Office Action dated Nov. 30, 2016", w/ English Translation, 12 pgs.

"Taiwanese Application Serial No. 104119398, Response filed Feb. 2, 2017 to Office Action dated Nov. 30, 2016", w/ English Claims, 14 pgs.

* cited by examiner

ELECTRONIC PACKAGE AND METHOD OF CONNECTING A FIRST DIE TO A SECOND DIE TO FORM AN ELECTRONIC PACKAGE

TECHNICAL FIELD

Embodiments described herein generally relate to an electronic package and a method of connecting a first die to another die to form an electronic package.

BACKGROUND

Minimizing transistor size in order to keep up with Moore's law continually requires reducing first level interconnect (FLI) pitch and bump size. In addition, using advanced dielectrics has often resulted in utilizing low-k and extremely low-k materials in silicon.

The combination of these factors results in higher sensitivity to stress during assembly and thermo-mechanical stress. Therefore, with each new technological advancement, solutions for reducing thermo-mechanical stress become significantly more important.

During a capillary underfill assembly process, designers need to incorporate a keep-out-zone (KOZ) for epoxy in order to allow the epoxy to be placed against at least one side of the die (possibly more than one side for larger dies). The need to incorporate a KOZ typically adds to the overall form factor of the electronic package.

One of the previous solutions to reduce thermo-mechanical stress is to use a capillary underfill (CUF) process. A typical CUF process forms a fillet around a die edge to aid in stress reduction. In order to achieve a tighter KOZ, additional steps (e.g., physical or chemical barriers) are usually required.

Another conventional solution uses a molded underfill (MUF) process. MUF processes are commonly used to provide stress reduction and warpage control for thin packages.

Stress-related failures are typically more critical (and prevalent) in large die packages. As examples, server and flip chip ball grid array (FCBGA) packages are usually more costly. In addition, FCBGA packages are commonly used in applications under extreme conditions (e.g., military applications) where reliability failures have to be extremely low.

Large electronic packages are also commonly subject to other types of failures. As examples, inter-layer dielectric delamination commonly occurs in larger packages. In addition, fillet cracks and solder resist cracks commonly occur in larger packages.

Thermo-mechanical modeling has shown that fillet geometry plays a big role in stress reduction. FIG. 1 shows the maximum UF and SR stress on a typical processor. FIG. 1 illustrates that a high fillet provides 50% less stress than a lower fillet.

Current CUF processes can typically only control the CUSP. The CUSP is usually dependent on the amount of epoxy. When more epoxy is used a larger fillet is created for a fixed size KOZ. One of drawbacks with current CUF processes is that they are usually unable to provide tailored fillet geometries.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The example electronic packages and methods described herein may provide a superior fillet geometry that reduces stress in the electronic package. FIGS. 1A-1E show a comparison of measured stress for conventional fillet geometries versus an example fillet geometry that may be included in some of the electronic packages and methods described herein.

As shown in FIG. 1, close to a 100% stress reduction in SR and UF may be achieved by the example fillet geometry that may be included in some of the electronic packages and methods described herein.

Figure 1A:
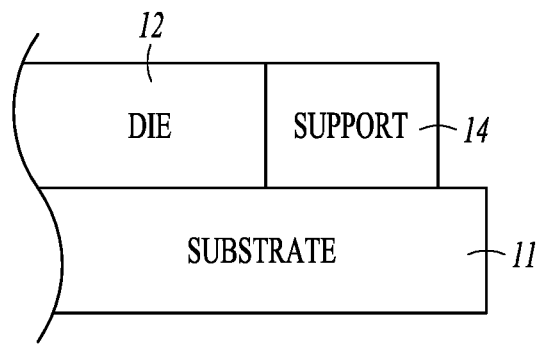
FIGS. 1A-1E show a comparison of measured stress for conventional fillet geometries versus an example fillet geometry that may be included in some of the electronic packages and methods described herein.
Figure 1B:
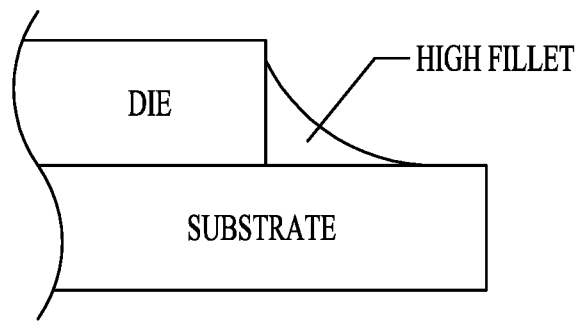
Figure 1C:
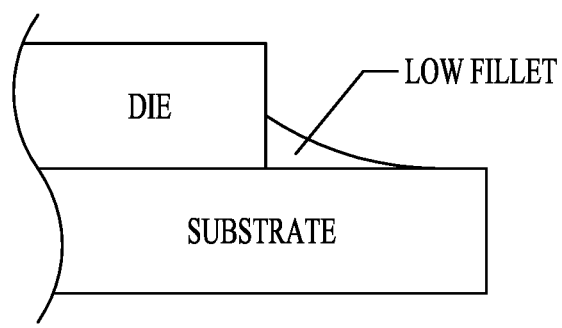
Figure 1D:
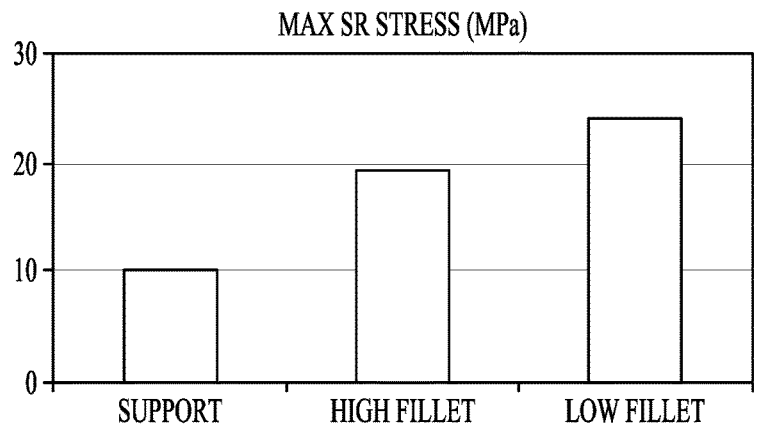
Figure 1E:
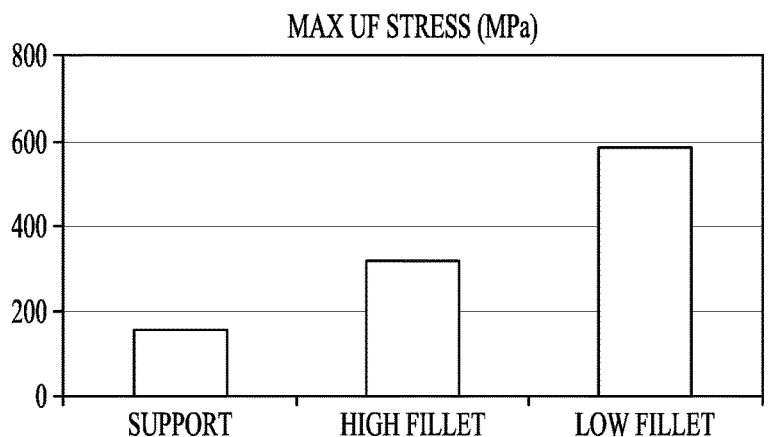

FIG. 1A shows an example fillet geometry proposed in some of the electronic packages and methods described herein. FIG. 1B shows a high fillet geometry with CUSP of 1 mils FIG. 1C shows a low fillet geometry with CUSP of 11 mils.

Figure 2:
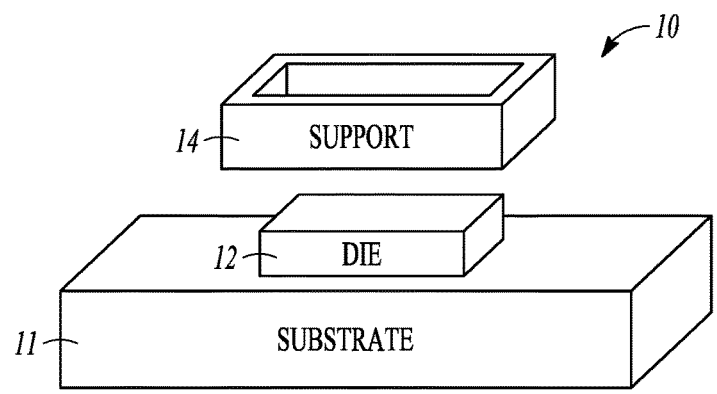
FIG. 2 illustrates an exploded view of an example electronic package.

In some forms of the electronic packages and methods described herein, a semi-cured epoxy window frame-like cut outs is used in conjunction with a CUF process (see e.g., FIG. 2). In some example forms, the underfill in the CUF process may be used to protect the FLI region of the electronic package. In addition, the underfill in the CUF process may be used to 'glue' the epoxy block in place. The electronic packages and methods described herein may provide stress reduction and tighter KOZ's.

Figure 3A:
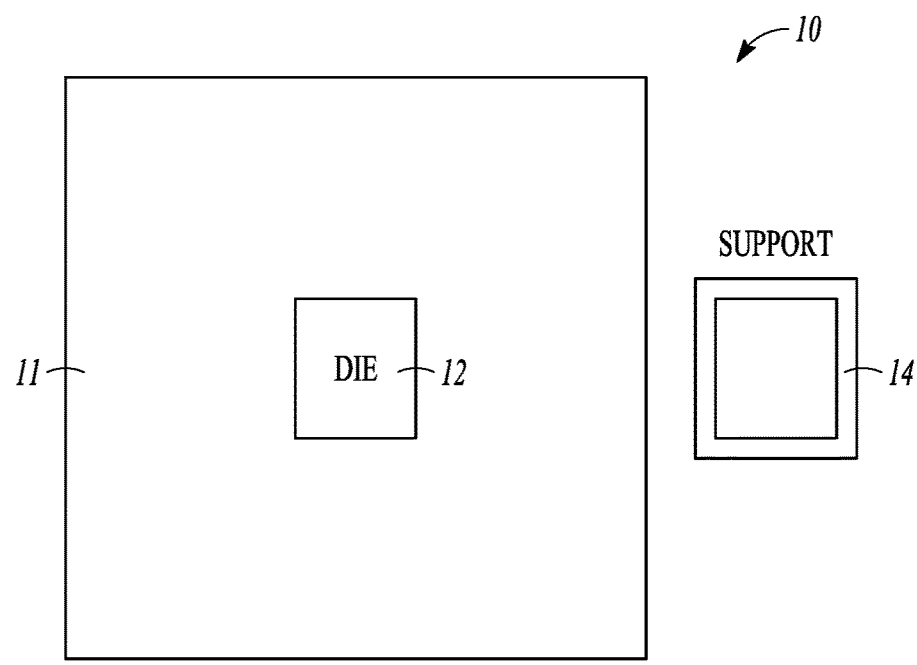
FIG. 3A shows a top view of the die and the support shown in FIG. 2 before the support is placed around the die.
Figure 3B:
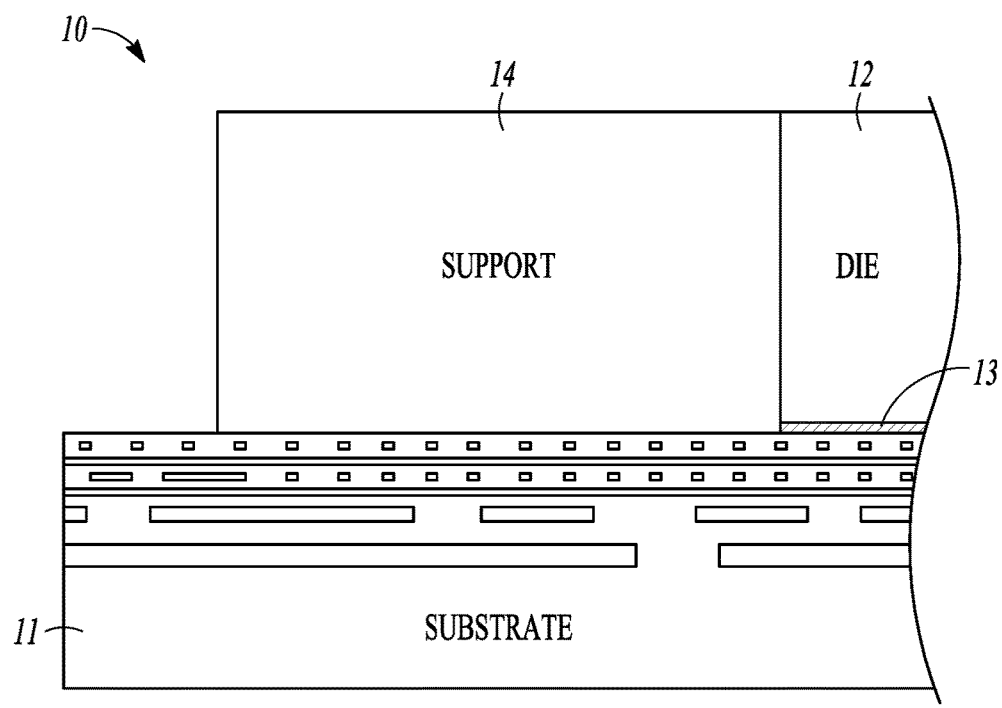
FIG. 3B shows a cross-sectional view of the electronic package 10 shown in FIG. 3A after the underfill has been cured to secure the support to the underfill.

FIGS. 3A and 3B show an example electronic package 10. The electronic package 10 includes a substrate 11 and a die 12 attached to the substrate 11. The electronic package 10 further includes an underfill 13 positioned between the die 12 and the substrate 11 due to capillary action.

A support 14 surrounds the die 12. The support 14 provides the same beneficial fillet geometry on all die 12 edges. Therefore, the support 14 provides similar stress reduction on all die edges.

In the example form shown in FIGS. 3A & 3B, the support 14 has a substantially uniform cross-section. It should be noted that specialized supports are contemplated where the support 14 may be designed to provide higher stress margins on one edge of the die 12 if that edge of the die 12 has higher localized stress.

In some forms, the support 14 may be an epoxy block that is fabricated using existing industrial processes (e.g., stamping, extrusion, rolling, etc.). As an example, the epoxy block may be cut out from a solid block of cured underfill by using wire and/or water jet saws.

In some forms of the electronic package 10, the die 12 is flip chip bonded to the substrate 11. The manner in which the die 12 is bonded to the substrate 11 will depend in part on cost, manufacturing considerations and the functionality associated with fabricating the electronic package 10 (among other factors).

It should be noted that the underfill 13 may secure the support 14 to the substrate 11 and/or the die 12. The determination as to whether the support 14 is secured to the substrate 11 and/or the die 12 may be based in part on the types of materials and components that are used in the electronic package 10 as well as the associated manufacturing costs (among other factors).

The underfill 13 may be formed of an epoxy-like material, or any other material that is known now or discovered in the future. The type of material that is used for the underfill 13 will depend in part on cost, manufacturing considerations and the functionality associated with fabricating the electronic package 10 (among other factors).

FIG. 3A shows a top view of the die 12 and the support 14 before the support 14 is placed around the die 14. FIG. 3B shows a cross-sectional view of the electronic package 10 after the underfill 13 has been cured to secure the support 14 to the underfill 13. There may be a strong interface between the support 14 and underfill 13 such that reliability concerns associated with the electronic may be reduced.

Figure 4B:
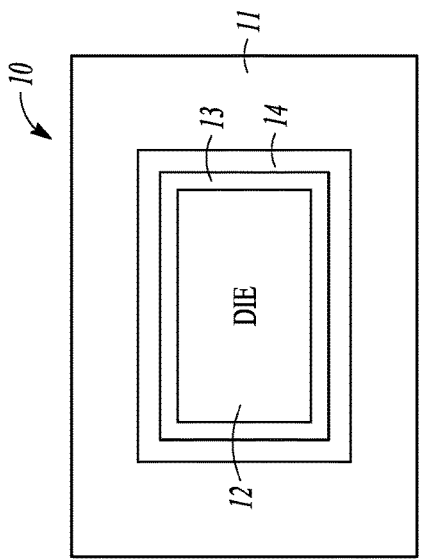
FIGS. 4A and 4B illustrate another example electronic package where the support includes a chamfered inner bottom edge.
Figure 4D:
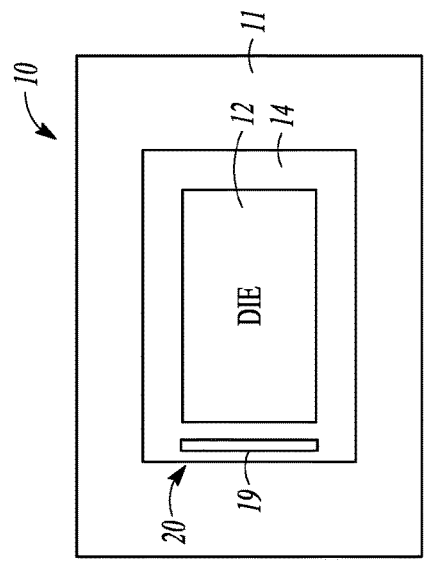
FIGS. 4C and 4D illustrate another example electronic package where the support includes a passage and an outer surface.
Figure 4A:
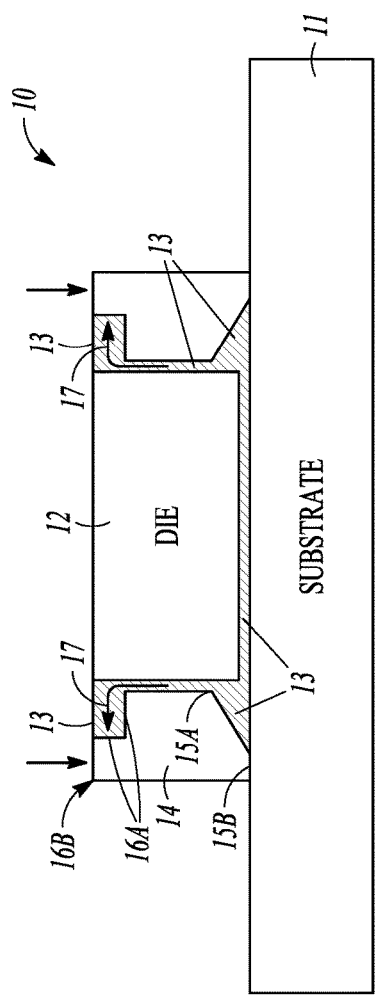

FIGS. 4A and 4B illustrate another example electronic package 10 where the support 14 includes an inner bottom edge 15A and an outer bottom edge 15B. The inner bottom edge 15A is chamfered to receive underfill 13 when the support 14 is mounted around the die 12.

In the example form of the electronic package 10 shown in FIGS. 4A & 4B, the support 14 an inner upper edge 16A and an inner outer upper edge 16B. The inner upper edge 16A includes a channel 17 that receives excess underfill 13 which flows upward between the die 12 and the support 14 when the support 14 is mounted around the die 12.

The force applied to the underfill 13 by the support 14 as the support 14 is mounted around the die 12 pushes the underfill 13 upward in the region between the die 12 and the support 14. The excess underfill 13 may be stored in the channel 17 to avoid underfill 13 rollover on to die 12.

Figure 4C:
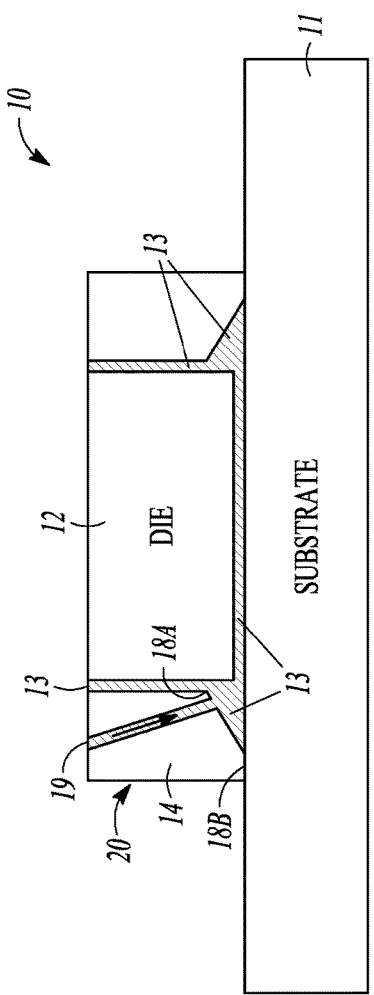

FIGS. 4C and 4D illustrate another example electronic package 10 where the support 14 includes an inner lower edge 18A and an outer lower edge 18B. The support 14 further includes a passage 19 and an outer surface 20. The passage 19 extends from the inner lower edge 18A of the support 14 to the outer surface 20 of the support 14 such that the underfill 13 may flow from the outer surface 20 through the passage 19 to the inner lower edge 18 after the support 14 is mounted around the die 12.

In the example form shown in FIGS. 4C and 4D, the support 14 may be placed around the die 12 prior to the CUF process. The passage 19 in the support 14 may be used to guide the underfill 13 flow to the inner lower edge 18A of the support 14 (i.e., the FLI region of the die 12). Placing the support 14 around the die 12 prior to the application of the underfill 13 may reduce underfill 13 bleed out.

It should be noted that the passage 19 may extend from the outer surface 20 of the support 14 on (i) one side of the support 14; (ii) multiple sides of the support 14; or (iii) all sides of the support 14. In addition, the support 14 may include multiple passages 19 on one, some or all sides of the support 14. The number of passages 19, as well as number of sides that include passages 19, may depend in part on the types of materials and components that are used in the electronic package 10 as well as the associated manufacturing costs (among other factors).

Figure 5:
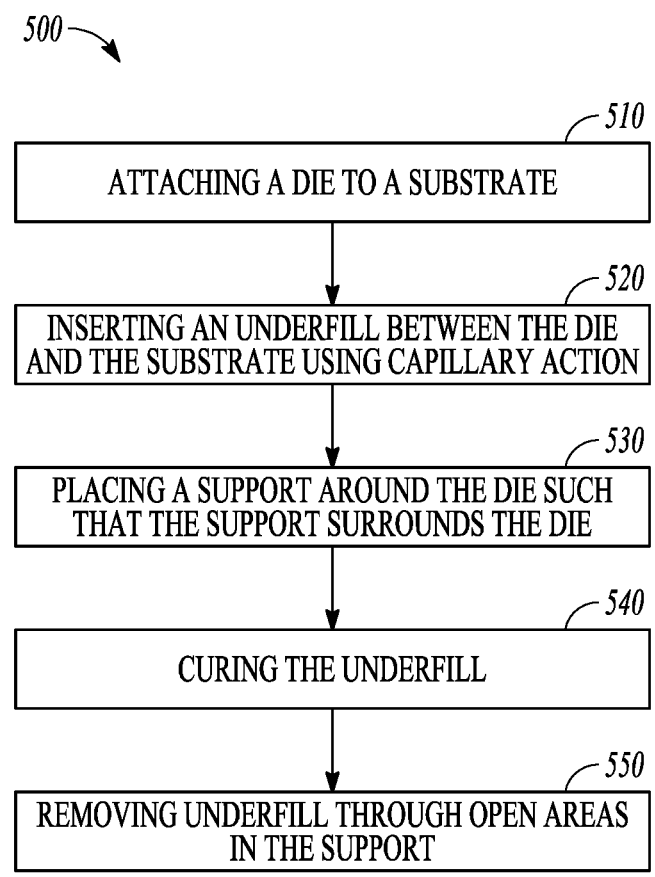
FIG. 5 is a flow diagram illustrating an example method of fabricating the example electronic packages shown in FIGS. 2-4.

FIG. 5 is a flow diagram illustrating a method [500] of fabricating an electronic package 10 (see FIGS. 2 & 3). The method [500] includes [510] attaching a die 12 to a substrate 11 and [520] inserting an underfill between the die 12 and the substrate 11 using capillary action.

The method [500] further includes [530] placing a support 14 around the die 12 such that the support 14 surrounds the die 12. It should be noted that the support 14 may be more easily placed around the die 12 when the substrate 11 includes fiducial marks (not shown), especially in high volume manufacturing processes.

In some forms of the method [500], [510] attaching the die 12 to the substrate 11 may include attaching the die 12 to the substrate 11 using flip chip bonding. The manner in which the die 12 is attached to the substrate 11 will depend in part on cost, manufacturing considerations and the functionality associated with fabricating the electronic package 10 (among other factors).

In addition, [530] placing a support 14 around the die 12 such that the support 14 surrounds the die 12 may include (i) attaching the support 14 to the die 12 using the underfill 13; and/or (ii) attaching the support 14 to the substrate 11 using the underfill 13. The determination as to whether the support 14 is secured to the substrate 11 and/or the die 12 may be based in part on the types of materials and components that are used in the electronic package 10 as well as the associated manufacturing costs (among other factors).

The method [500] may further include [540] curing the underfill 13. The appropriate curing process may be based in part on the types of materials and components that are used in the electronic package 10 as well as the associated manufacturing costs (among other factors).

In some forms of the method [500], [530] placing a support 14 around the die 12 such that the support 14 surrounds the die 12 may be done as soon as possible after [520] inserting an underfill between the die 12 and the substrate 11 using capillary action and as soon as possible before [540] curing the underfill 13. The support 14 may be placed as soon as possible after [520] inserting an underfill 13 and before [540] curing the underfill 13 in order to ensure good adhesion between support 14 and the underfill 13.

The method [500] may further include [550] removing some of the underfill 13 through open areas in the support 14 (see, e.g., FIGS. 4A & 4B). As an example, the support 14 may include an inner upper edge 16A and an inner outer upper edge 16B. The inner upper edge 16A includes a channel 17 that receives excess underfill 13 which flows upward between the die 12 and the support 14 during [530] placing a support 14 around the die 12 such that the support 14 surrounds the die 12.

The force applied to the underfill 13 by the support 14 as the support 14 is mounted around the die 12 pushes the underfill 13 upward in the region between the die 12 and the support 14. In some forms of the method [600], the excess underfill 13 may be stored in a channel 17 to avoid underfill 13 rollover on to die 12.

As shown in FIGS. 4C and 4D, in some forms of the method [500], [520] inserting an underfill 13 between the die 12 and the substrate 11 using capillary action may include inserting the underfill 13 through a passage 19 in the support 14 from an outer surface 20 of the support 14 to a lower inner edge 18A of the support 14 (i.e., the FLI region of the die 12). It should be noted that the passage 19 may extend from the outer surface 20 of the support 14 on (i) one side of the support 14; (ii) multiple sides of the support 14; or (iii) all sides of the support 14.

In addition, the support 14 may include multiple passages 19 on one, some or all sides of the support 14. The number of passages 19, as well as number of sides that include passages 19, may depend in part on the types of materials and components that are used in the electronic package 10 as well as the associated manufacturing costs (among other factors).

Figure 6A:
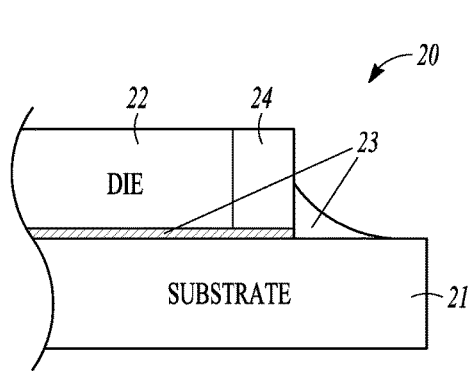
FIG. 6A is a schematic side view of electronic package.
Figure 6B:
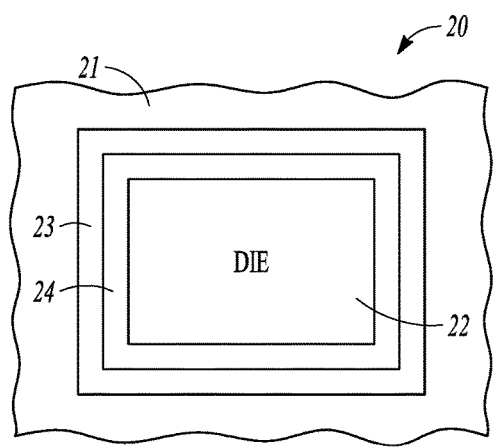
FIG. 6B is a schematic top view of the electronic package shown in FIG. 6A.

FIG. 6A is a schematic side view of electronic package 20. FIG. 6B is a schematic top view of the electronic package 20 shown in FIG. 6A. The electronic package 20 includes a die 22 and a support 24 molded to the die 22 such that the support 24 surrounds the die 22. The electronic package 20 further includes a substrate 21 and an underfill 23 that attaches the die 22 and the support 24 to the substrate 21. The underfill 23 extends between the support 24 and die 22 combination on one side and the substrate 21 on the other side due to capillary action of the underfill 23.

The type, size and configuration of the die 22 and the support 24 that are included in the electronic package 20 will depend in part on the overall desired configuration and function of the electronic package 20.

In some forms of the electronic package 20, the die 22 is flip chip bonded to the substrate 21. The manner in which the die 22 is bonded to the substrate 21 will depend in part on cost, manufacturing considerations and the functionality associated with fabricating the electronic package 20 (among other factors).

Forms of the electronic package 20 are contemplated where the substrate 21 includes a plurality of redistribution layers (not shown) and the underfill 23 attaches the die 22 and support 24 combination to at least one of the redistribution layers that form the substrate 21. As an example, the die 22 may be attached to conductors within one of the redistribution layers by thermal compression bonding.

It should be noted that the die 22 may be attached to conductors within one of the redistribution layers by any bonding method that is known now or discovered in the future. The manner in which the die 22 is bonded to the substrate 21 will depend in part on cost, manufacturing considerations and the functionality associated with fabricating the electronic package 20 (among other factors).

As discussed above with regard to electronic package 10, the support 24 in electronic package 20 may have a substantially uniform cross-section. It should be noted that specialized supports are contemplated where the support 24 may be designed to provide higher stress margins on one edge of the die 22 if that edge of the die 22 has higher localized stress.

Figure 6C:
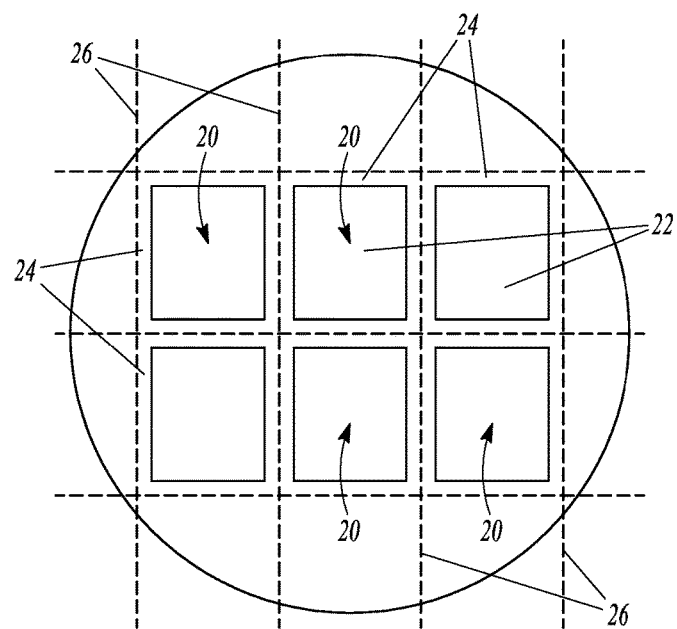
FIG. 6C shows a wafer that includes a plurality of electronic packages.
Figure 7:
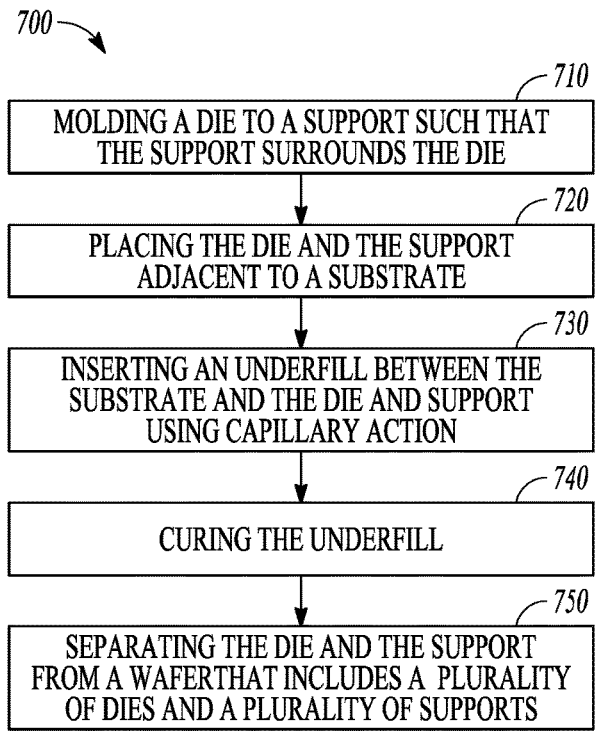
FIG. 7 is a flow diagram illustrating an example method of fabricating the example electronic packages shown in FIGS. 6A-6C.

FIG. 7 is a flow diagram illustrating an example method [700] of fabricating the example electronic package 20 shown in FIGS. 6A-6C. The method [700] includes [710] molding a die 22 to a support 24 such that the support 24 surrounds the die 22 and [720] placing the die 22 and the support 24 adjacent to a substrate 21. The method [700] further includes [730] inserting an underfill 23 between the support 24 and die 22 combination and the substrate 21 using capillary action.

In some forms of the method [700], [720] placing the die 22 and the support 24 adjacent to the substrate 21 includes attaching the die 22 to the substrate 21 using flip chip bonding. The manner in which the die 22 is attached to the substrate 21 will depend in part on cost, manufacturing considerations and the functionality associated with fabricating the electronic package 20 (among other factors).

The method [700] may further include [740] curing the underfill in the electronic package 20. The appropriate curing process may be based in part on the types of materials and components that are used in the electronic package 20 as well as the associated manufacturing costs (among other factors).

The method [700] may further include [750] separating the die 22 and support 24 combination from a wafer 25 that includes a plurality of electronic packages 20 where each electronic package 20 includes a die 22 and a support 24. FIG. 6C shows a wafer 25 that includes a plurality of electronic packages 20.

In some forms of the method [700], each of the electronic packages may be separated from one another by cutting through the wafer 25 (e.g., along lines 26). The appropriate separation process may be based in part on the types of materials and components that are used in the electronic package 10 as well as the associated manufacturing costs (among other factors).

The method [700] described herein may permit single or multiple dice 22 to be fabricated with supports 24 for subsequent fabrication into electronic packages. As an example, the die 22 may be molded to the substrate 24 by using a modified eWLB (Embedded Wafer level Ball Grid Array) process.

It should be noted that electronic packages 20 that are fabricated with a modified eWLB process may be well suited for high volume manufacturing. In addition, the die 22 may be embedded in one of the redistribution layers that form the substrate 21 when the electronic package 20 is fabricated with a modified eWLB process. The degree to which the die 22 is embedded in the substrate 21 will depend in part on cost, configuration, manufacturing considerations and functionality associated with fabricating the electronic package 10 (among other factors).

The underfill 23 may be formed of an epoxy-like material, or any other material that is known now or discovered in the future. The type of material that is used for the underfill 23 will depend in part on cost, manufacturing considerations and the functionality associated with fabricating the electronic package 80 (among other factors).

Other forms of the method [700] are contemplated where similar processes (or portions of processes) are repeated in order to place additional dice 22 on the same substrate 21. The additional dice 22 may be embedded in the substrate 21 or attached to the substrate 21 using flip-chip bonding.

SIMPLE CONCLUSION

In some forms, the electronic packages and methods described herein may provide improved reliability. As an example, a greater than 100% stress reduction may be obtained. In addition, a lower failure rate may be obtained for larger die packages.

It should be noted epoxy blocks may be designed differently depending on the stress requirements for various products. As an example, moisture uptake may be reduced because better suited materials may be used to restrict moisture uptake (as compared to materials used in conventional CUF/MUF processes).

In some forms, the electronic packages and methods described herein may promote cost reduction through improved reliability and greater KOZ control. As an example, the electronic packages and methods described herein may provide cost savings over potential MUF processes because many conventional MUF processes waste 95% of the molding material thereby incurring unnecessary costs.

In addition, the electronic packages and methods described herein may require just one curing step. The need for only one cure step may provide an assembly cost reduction as compared to conventional processes.

The electronic packages and methods described herein may provide better warpage control as compared to conventional electronic packages and methods. One factor that causes the electronic packages and methods described herein to provide better warpage control is that in some forms, the entire substrate may be covered with an epoxy block. Since the entire substrate may be covered with an epoxy block, the electronic packages and methods described herein may be used as a MUF replacement.

In addition, the epoxy block may enable use of wider range of materials that promote improved manufacturability versus conventional processes. It should be noted that some of the potential materials may provide better control over warpage knobs. Prediction and control of MUF warpage is currently very poor in existing processes due in part to a high sensitivity to warpage knobs.

To better illustrate the method and apparatuses disclosed herein, a non-limiting list of embodiments is provided here.

Example 1 includes an electronic package. The electronic package a substrate; a die attached to the substrate; and an underfill positioned between the die and the substrate due to capillary action; and a support surrounding the die.

Example 2 includes the electronic package of example 1, wherein the die is flip chip bonded to the substrate.

Example 3 includes the electronic package of any one of examples 1-2, wherein the underfill secures the support to the substrate.

Example 4 includes the electronic package of any one of examples 1-3, wherein the underfill secures the support to the die.

Example 5 includes the electronic package of any one of examples 1-4, wherein the support has a substantially uniform cross-section.

Example 6 includes the electronic package of any one of examples 1-5, wherein the support has an inner bottom edge and an outer bottom edge, the inner bottom edge being chamfered to receive underfill when the support is mounted around the die.

Example 7 includes the electronic package of example 6, wherein the support has an inner upper edge and an inner outer upper edge, the inner upper edge including a channel to receive excess underfill that flows upward between the die and the support when the support is mounted around the die.

Example 8 includes the electronic package of any one of examples 1-7, wherein the cross-section of the support changes such that the cross-section is larger in areas of relatively higher stress on the die and smaller in areas of relatively lower stress on the die.

Example 9 includes the electronic package of example 8, wherein the support has an inner lower edge and an outer lower edge, the support including a passage and an outer surface, the passage extending from the inner lower edge of the support to the outer surface of the support such that the underfill flows from the outer surface through the passage to the inner lower edge when the support is mounted around the die.

Example 10 includes the electronic package of example 9, wherein the passage extends from the outer surface of the support on one side of the support.

Example 11 includes a method that includes attaching a die to a substrate; inserting an underfill between the die and the substrate using capillary action; and placing a support around the die such that the support surrounds the die.

Example 12 includes the method of any one of example 11, wherein attaching the die to the substrate includes attaching the die to the substrate using flip chip bonding.

Example 13 includes the method of any one of examples 11-12, wherein placing a support around the die such that the support surrounds the die includes attaching the support to the die using the underfill.

Example 14 includes the method of any one of examples 11-13, wherein placing a support around the die such that the support surrounds the die includes attaching the support to the substrate using the underfill.

Example 15 includes the method of any one of examples 11-14, and further including curing the underfill.

Example 16 includes the method of any one of examples 11-15, and further including removing underfill through open areas in the support.

Example 17 includes the method of any one of examples 11-16, wherein inserting an underfill between the die and the substrate using capillary action includes inserting the underfill through a passage in the support from an outer surface of the support to a lower inner edge of the support.

Example 18 includes an electronic package. The electronic package includes a die; a support molded to the die, wherein the support surrounds the die; a substrate; and an underfill that attaches the die and the support to the substrate due to capillary action of the underfill between the support and the die and the substrate.

Example 19 includes the electronic package of example 18, wherein the die is flip chip bonded to the substrate.

Example 20 includes the electronic package of any one of examples 18-19, wherein the substrate includes a plurality of redistribution layers and the underfill attaches the die and the support to at least one of the redistribution layers that form the substrate.

Example 21 includes the electronic package of any one of examples 18-20, wherein the support has a substantially uniform cross-section.

Example 22 includes a method that includes molding a die to a support such that the support surrounds the die; placing the die and the support adjacent to a substrate; and inserting an underfill between the substrate and the die and support using capillary action.

Example 23 includes the method of example 22, wherein placing the die and the support adjacent to the substrate includes attaching the die to the substrate using flip chip bonding.

Example 24 includes the method of any one of examples 22-23, and further including curing the underfill.

Example 25 includes the method of any one of examples 22-24, and further including separating the die and the support from a wafer that includes a plurality of dies and a plurality of supports.

These and other examples and features of the present electronic device, solder compositions, and related methods will be set forth in part in the detailed description. This overview is intended to provide non-limiting examples of the present subject matter—it is not intended to provide an exclusive or exhaustive explanation. The detailed description is included to provide further information about the systems, and methods.

Figure 8:
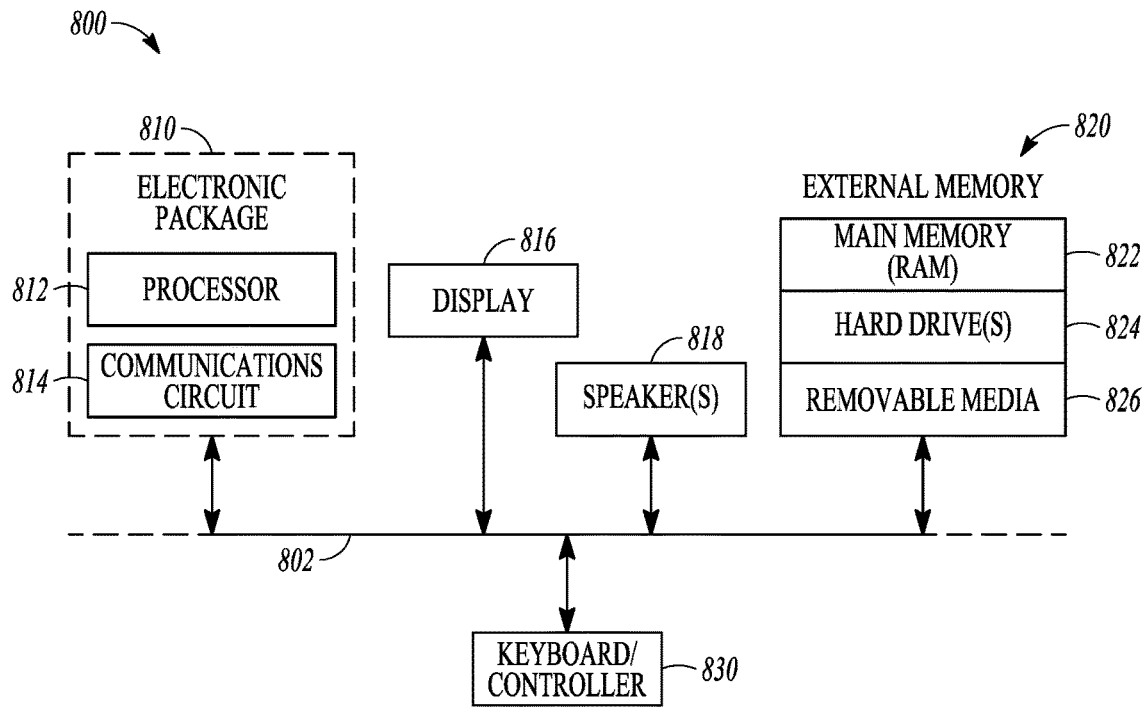
FIG. 8 is a block diagram of an electronic device incorporating at least one electronic package and/or method described herein.

An example of an electronic device using the electronic packages methods that are described in the present disclosure is included to show an example of a higher level device application for the present invention. FIG. 8 is a block diagram of an electronic device 800 incorporating at least one electronic package and/or method described herein. Electronic device 800 is merely one example of an electronic system in which embodiments of the present invention may be used.

Examples of electronic devices 800 include, but are not limited to personal computers, tablet computers, mobile telephones, game devices, MP3 or other digital music players, etc. In this example, electronic device 800 comprises a data processing system that includes a system bus 802 to couple the various components of the system. System bus 802 provides communications links among the various components of the electronic device 800 and can be implemented as a single bus, as a combination of busses, or in any other suitable manner.

An electronic package 810 is coupled to system bus 802. The electronic package 810 can include any circuit or combination of circuits. In one embodiment, the electronic package 810 includes a processor 812 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic package 810 are a custom circuit, an application-specific integrated circuit (ASIC), or the like, such as, for example, one or more circuits (such as a communications circuit 814) for use in wireless devices like mobile telephones, tablet computers, laptop computers, two-way radios, and similar electronic systems. The IC can perform any other type of function.

The electronic device 800 can also include an external memory 820, which in turn can include one or more memory elements suitable to the particular application, such as a main memory 822 in the form of random access memory (RAM), one or more hard drives 824, and/or one or more drives that handle removable media 826 such as compact disks (CD), flash memory cards, digital video disk (DVD), and the like.

The electronic device 800 can also include a display device 816, one or more speakers 818, and a keyboard and/or controller 830, which can include a mouse, trackball, touch screen, voice-recognition device, or any other device that permits a system user to input information into and receive information from the electronic device 800.

This overview is intended to provide non-limiting examples of the present subject matter—it is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations.

The scope of the invention should be determined with reference to the appended claims, along with the full scope of equivalents to which such claims are entitled.

The invention claimed is:

1. An electronic package comprising:
   a substrate;
   a die attached to the substrate;
   an underfill positioned between the die and the substrate due to capillary action; and
   a support completely surrounding the die, wherein the support has an inner lower edge and an outer lower edge, the support including a passage and an outer surface, the passage extending from the inner lower edge of the support to the outer surface of the support such that the underfill flows from the outer surface through the passage to the inner lower edge when the support is mounted around the die.

2. The electronic package of claim 1, wherein the passage extends from the outer surface of the support on one side of the support.

3. The electronic package of claim 1, wherein the die is flip chip bonded to the substrate.

4. The electronic package of claim 1, wherein the underfill secures the support to the substrate.

5. The electronic package of claim 1, wherein the underfill secures the support to the die.

6. The electronic package of claim 1, wherein the support has a substantially uniform cross-section.

7. The electronic package of claim 1, wherein the cross-section of the support changes such that the cross-section is larger in areas of relatively higher stress on the die and smaller in areas of relatively lower stress on the die.

\* \* \* \* \*